(12) United States Patent
Gaynor

(10) Patent No.: US 9,276,527 B2
(45) Date of Patent: Mar. 1, 2016

(54) METHODS AND DEVICES FOR IMPEDANCE MATCHING IN POWER AMPLIFIER CIRCUITS

(71) Applicant: PEREGRINE SEMICONDUCTOR CORPORATION, San Diego, CA (US)

(72) Inventor: Michael P. Gaynor, Crystal Lake, IL (US)

(73) Assignee: Peregrine Semiconductor Corporation, San Diego, CA (US)

(*) Notice: Subject to any disclaimer, the term of this patent is extended or adjusted under 35 U.S.C. 154(b) by 0 days.

(21) Appl. No.: 14/042,312

(22) Filed: Sep. 30, 2013

(65) Prior Publication Data

US 2015/0091656 A1   Apr. 2, 2015

(51) Int. Cl.
*H03F 1/14* (2006.01)
*H03F 1/22* (2006.01)
*H03F 1/56* (2006.01)
*H03F 3/193* (2006.01)
*H03F 3/72* (2006.01)

(52) U.S. Cl.
CPC ............ *H03F 1/223* (2013.01); *H03F 1/56* (2013.01); *H03F 3/193* (2013.01); *H03F 3/72* (2013.01); *H03F 2200/378* (2013.01); *H03F 2200/387* (2013.01)

(58) Field of Classification Search
CPC ..... H03F 2200/451; H03F 3/245; H03F 3/72; H03F 3/193; H03F 3/195; H03F 3/211; H03F 3/68; H03F 2203/7209; H03F 1/0277; H03F 2200/111; H03F 2200/267; H03F 3/19; H03F 3/45179; H03F 3/21; H03F 2200/391; H03F 2203/7215; H03F 2203/7221; H03F 2203/7233
USPC ............ 330/51, 124 R, 295, 302, 311
See application file for complete search history.

(56) References Cited

U.S. PATENT DOCUMENTS

| | | | |
|---|---|---|---|
| 6,137,355 A | 10/2000 | Sevic et al. | |
| 6,137,367 A | 10/2000 | Ezzedine et al. | |
| 6,255,906 B1 | 7/2001 | Eidson et al. | |
| 6,377,117 B2 | 4/2002 | Oskowsky et al. | |
| 6,804,502 B2 | 10/2004 | Burgener et al. | |
| 7,170,341 B2 | 1/2007 | Conrad et al. | |
| 7,202,734 B1 | 4/2007 | Raab | |
| 7,248,120 B2 | 7/2007 | Burgener et al. | |
| 7,486,135 B2 * | 2/2009 | Mu .............................. | 330/51 |

(Continued)

FOREIGN PATENT DOCUMENTS

WO   WO 2009/108391   9/2009

OTHER PUBLICATIONS

Nguyen, Hieu, Office Action received from the USPTO dated Oct. 9, 2014 for U.S. Appl. No. 13/797,779, 6 pgs.
Kim, et al. "Efficiently Amplified." IEEE Microwave Magazine, Aug. 2010, pp. 87-100.
McCune, et al. "Microwave Bytes." IEEE Microwave Magazine, Jun. 2012, pp. 34-56.

(Continued)

*Primary Examiner* — Khanh V Nguyen
(74) *Attorney, Agent, or Firm* — Jaquez Land Richman LLP; Martin J. Jaquez, Esq.; Alessandro Steinfl, Esq.

(57) ABSTRACT

Methods of turning on and/or turning off amplifier segments in a scalable periphery amplifier architecture are described in the present disclosure. The turning on and/or turning off the amplifier segments according to the various embodiments of the present can reduce spectral splatter in adjacent channels. In some embodiments, amplifier performance and efficiency can be improved by dissipating heat more uniformly.

18 Claims, 13 Drawing Sheets

(56) References Cited

U.S. PATENT DOCUMENTS

| | | | |
|---|---|---|---|
| 7,629,843 | B2 | 12/2009 | Paul et al. |
| 7,795,968 | B1 | 9/2010 | Li et al. |
| 7,910,993 | B2 | 3/2011 | Brindle et al. |
| 7,911,277 | B2 | 3/2011 | Paul et al. |
| 8,138,829 | B2 | 3/2012 | Reddy et al. |
| 8,150,343 | B2 * | 4/2012 | Ramachandra Reddy . 455/127.2 |
| 8,188,788 | B2 | 5/2012 | Lee |
| 8,244,194 | B2 | 8/2012 | Morgan et al. |
| 8,330,547 | B2 * | 12/2012 | Godbole ................. 330/311 |
| 2014/0266433 | A1 | 9/2014 | Nobbe et al. |
| 2014/0266460 | A1 | 9/2014 | Nobbe et al. |
| 2015/0091657 | A1 | 4/2015 | Gaynor |

OTHER PUBLICATIONS

Wang, et al. "MM-Wave Integration and Combinations." IEEE Microwave Magazine, Jul./Aug. 2012, pp. 49-57.

Asbeck, et al. "Si IC Development for High Efficiency Envelope Tracking Power Amplifiers." IEEE Microwave Magazine, 2012, pp. 1-4.

Li, et al. "Design of High Efficiency Monolithic Power Amplifier With Envelope-Tracking and Transistor Resizing for Broadband Wireless Applications." IEEE Journal of Solid-State Circuits, vol. 47 (9), Sep. 2012, pp. 1-12.

Wimpenny, et al. Envelope Tracking GaAs HBT PA performance characterization under high load mismatch conditions, IEEE, 2012, pp. 37-40.

Kihara, T. et I. "A Multiband LTE SAW-less CMOS Transmitter with Source-Follower-Drived Passive Mixers, Envelope-Tracked RF-PGAs, and Marchand Baluns." IEEE Radio Frequency Integrated Circuits Symposium, 2012, pp. 399-402.

Leifso, C. et al. "A Fully Integrated Active Inductor with Independent Voltage Tunable Inductance and Series-Loss Resistance." IEEE Transactions on Microwave Theory and Techniques, vol. 49 (4), Apr. 2001, pp. 671-676.

Hedayati, H. et al. A 2-GHz Highly Linear Efficient Dual-Mode BiCMOS Power Amplifier Using a Reconfigurable Matching Network, IEEE Journal of Solid State Circuits, 2012, pp. 1-20.

Kawai, K. et al. "Ring Resonators for Bandwith and Center Frequency Tunable Filter." Proceedings of the 37th European Microwave Conference, Oct. 2007, pp. 298-301.

Oh, Hyoung-Seok, et al. "A Fully-Integrated +23-dBm CMOS Triple Cascode Linear Power Amplifier with Inner-Parallel Power Control Scheme." Radio Frequency Integrated Circuits (RFIC) Sympsium, 2006 IEEE, pp. 1-4.

Mohamed, et al. "Novel Reconfigurable Fundamental/Harmonic Matching Network for Enhancing the Efficiency of Power Amplifiers" 40th European Microwave Conference, Sep. 2010, pp. 1122-1125.

Tu, Steve, "A Power-Adaptive CMOS Class E RF Tuned Power Amplifier for Wireless Communications" IEEE, 2003, pp. 365-368.

Choi, et al. "A MMIC Smart Power Amplifier with On-Chip Dynamic Bias Controller for WCDMA Mobile Communication" IEEE, 2004, pp. 351-354.

Sankey, et al. "Adaptive Tuning for Handheld Transmitters" IEEE, 2009, pp. 225-228.

Kim, et al. "A Linear Multi-Mode Cmos Power Amplifier With Discrete Resizing and Concurrent Power Combining Structure" IEEE Journal of Solid-State Circuits vol. 46, No. 5, May 2011, pp. 1034-1048.

Ahmed, et al. "DTX: A Revolutionary Digital Transmitter Technology to Provide Multi-Mode/Multi-Band Capability" Proceeding of the SDR 04 Technical Conference and Product Exposition, 2004, pp. 1-5.

Kanda, et al. "A Fully Integrated Triple-Band CMOS Power Amplifier for WCDMA Mobile Handsets" IEEE International Solid-State Circuits Conference, Session 4, RF Techniques, 41, Feb. 20, 2012, pp. 86-88.

Kim, et al. "A Power Efficient W-CDMA Smart Power Amplifier With Emitter Area Adjusted for Output Power Levels" IEEE MTT-S Digest, 2004, pp. 1165-1168.

Gamal El Din, et al. "Adaptive Matching for Efficiency Enhancement of Switching Mode and Nonlinear Microwave Power Amplifiers" IEEE, 2010, pp. 192-195.

Vreede, et al. "Ultra-low Distortion Varactors for Adaptive RF Systems" European Microwave Week, Amsterdam, Oct. 2008, 26 pgs.

Asbeck, et al. "CMOS Handset Power Amplifiers: Directions for the Future" IEEE, 2012, 6 pgs.

Kim, et al. "A Multi-Band Reconfigurable Power Amplifier for UMTS Handset Applications" IEEE Radio Frequency Integrated Circuits Symposium, 2010, pp. 175-178.

Asbeck, et al. "Design Options for High Efficiency Linear Handset Power Amplifiers" IEEE, 2009, pp. 1-4.

Moon, J. et al. "Highly Efficient Saturated Power Amplifier." IEEE Microwave Magazine, Jan. 2012, pp. 125-131.

Babcock, W.C. "Intermodulation Interference in Radio Systems—Frequency of Occurrence and Control by Channel Selection." The Bell System Technical Journal, Jan. 1953, pp. 63-73.

Calvo, Carlos, "Calibration and temperature-compensation techniques using an rms-responding RF detector", Microwave/Millimeter-Wave Technology, www.rfdesign.com, Aug. 2006, pp. 28-35.

Hau, et al., "A WCDMA HBT Power Amplifier Module with Integrated Si DC Power Management IC for Current Reduction under Backoff Operation", 2007 IEEE Radio Frequency Integrated Circuits Symposium, pp. 75-78.

Degani, et al., "A 90nm CMOS PA Module for 4G applications with embedded PVT gain compensation circuit", Mobility Wireless Group, Intel Israel (74) Ltd., IEEE 2012, pp. 25-28.

Kim, et al., "High Efficiency and Linear Dual Chain Power Amplifier without/with Automatic Bias Current Control for CDMA Handset Applications", 12th GAAS Symposium—Amsterdam, 2004, pp. 531-534.

Sahu, et al., "A High Efficiency WCDMA RF Power Amplifier with Adaptive, Dual-Mode Buck-Boost Supply and Bias-Current Control", Manuscript received on May 9, 2006, revised on Sep. 1, 2006, IEEE, pp. 1-3.

Noh, et al., "An Intelligent Power Amplifier MMIC Using a New Adaptive Bias Control Circuit for W-CDMA Applications", IEEE Journal of Solid-State Circuits, vol. 39, No. 6, Jun. 2004, pp. 967-970.

Kousai, et al., "A 28.3mW PA-Closed Loop for Linearity and Efficiency Improvement Integrated in a +27.1dBm WCDMA CMOS Power Amplifier", ISSCC 2012, Session 4, RF Techniques, 4.6, 3 pgs.

Nobbe, et al., Response to Restriction Requirement fled in the USPTO on Dec. 9, 2014 for U.S. Appl. No. 13/797,779, 44 pgs.

Nguyen, Hieu P., Office Action received from the USPTO dated Jan. 26, 2015 for U.S. Appl. No. 13/797,779, 53 pgs.

Nguyen, Khanh V., Office Action received from the USPTO dated Apr. 17, 2015 for U.S. Appl. No. 14/042,331, 16 pgs.

Nobbe, et al., Response filed in the USPTO dated May 14, 2015 for U.S. Appl. No. 13/797,779, 52 pgs.

Ezzeddine, et al., "The High Voltage/High Power FET (HiVP1)", 2003 IEEE Radio Frequency Integrated Circuits Symposium, pp. 215-218.

Gaynor, Michael, Amendment filed in the USPTO dated Jul. 17, 2015 for U.S. Appl. No. 14/042,331, 9 pgs.

Nguyen, Hieu P., Notice of Allowance received from the USPTO dated Jul. 20, 2015 for U.S. Appl. No. 13/797,779, 13 pgs.

Nguyen, Khanh V., Final Office Action received from the USPTO dated Oct. 20, 2015 for U.S. Appl. No. 14/042,331, 8 pgs.

Nguyen, Hieu P., Notice of Allowance received from the USPTO dated Nov. 2, 2015 for U.S. Appl. no. 13/797,779, 12 pgs.

Gaynor, Michael, Amendment After Final filed in the USPTO dated Dec. 15, 2015 for U.S. Appl. No. 14/042,331, 8 pgs.

Nguyen, Hieu P., Notice of Allowance received from the USPTO dated Dec. 18, 2015 for U.S. Appl. No. 13/797,779, 20 pgs.

* cited by examiner

METHODS AND DEVICES FOR IMPEDANCE MATCHING IN POWER AMPLIFIER CIRCUITS

CROSS REFERENCE TO RELATED APPLICATIONS

The present application may be related to U.S. application Ser. No. 14/042,331 entitled Methods and Devices for Thermal Control in Power Amplifiers filed on even date herewith and incorporated herein by reference in its entirety.

BACKGROUND

1. Field

The present application relates to power amplifiers. More in particular, it relates to methods and devices for impedance matching in power amplifier circuits.

2. Description of Related Art

In the field of mobile radios, a manufacturer can be dependent on the ability to quickly turn changes to power amplifiers (PA) or a Power Amplifier Module (PAM). These changes can be due to last minute changes in specification for the mobile radio to meet desired system specifications. This is a very difficult task for those PA's and PAM's dependent on silicon technologies due in part to long design cycle times and also long fabrication cycle times. These technologies include, but are not limited to, CMOS, SOI CMOS, SOS CMOS and BiCMOS. Such changes can affect an internal operating temperature of the PA/PAM.

SUMMARY

According to a first aspect, a method of turning off a subset of amplifier segments in an amplifier circuit comprising a plurality of amplifier segments is described, the method comprising: providing a matching circuit coupled with the amplifier circuit, the matching circuit having a first impedance value substantially matching a first output impedance value of the amplifier circuit; determining a number of amplifier segments of the plurality of amplifier segments to be turned off; determining a second output impedance value of the amplifier circuit expected upon turning off the determined number of amplifier segments; changing the first impedance value of the matching circuit to a second impedance value of the matching circuit, the second impedance value of the matching circuit being substantially equal to the determined second output impedance value of the amplifier circuit; and turning off, upon the changing, the number of amplifier segments determined to be turned off, thus changing the first output impedance value of the amplifier circuit to an actual second output impedance value of the amplifier circuit, wherein the actual second output impedance value of the amplifier circuit substantially matches the second impedance value of the matching circuit.

According to a second aspect, a method for turning on a subset of amplifier segments in an amplifier circuit is described, the method comprising: providing a matching circuit coupled with the amplifier circuit, the matching circuit having a first impedance value substantially matching a first output impedance value of the amplifier circuit; determining a number of amplifier segments of a plurality of amplifier segments to be turned on; determining a second output impedance value of the amplifier circuit expected upon turning on the determined number of amplifier segments; turning on the number of amplifier segments determined to be turned on, wherein the turning on the number of amplifier segments establishes a second output impedance value of the amplifier circuit; and changing the first impedance value of the matching circuit to a second impedance value of the matching circuit, the second output impedance value of the matching circuit being substantially equal to the second output impedance value of the amplifier circuit.

According to a third aspect, a circuital arrangement is described, the arrangement comprising: an amplifier circuit comprising a plurality of amplifier segments; and a matching circuit coupled with the amplifier circuit, the matching circuit comprising one or more inductors and one or more digital tunable capacitors, wherein the amplifier circuit has a first output impedance value in a first configuration of the amplifier segments, the first output impedance value adapted to change to a second impedance value in a second configuration of the amplifier segments, and wherein an impedance value of the matching circuit is configured to be adjustable according to an output impedance value of the amplifier circuit before the output impedance value of the amplifier circuit is changed.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 9A-9C show amplifier devices in a scalable periphery architecture.

DETAILED DESCRIPTION

Figure 1:
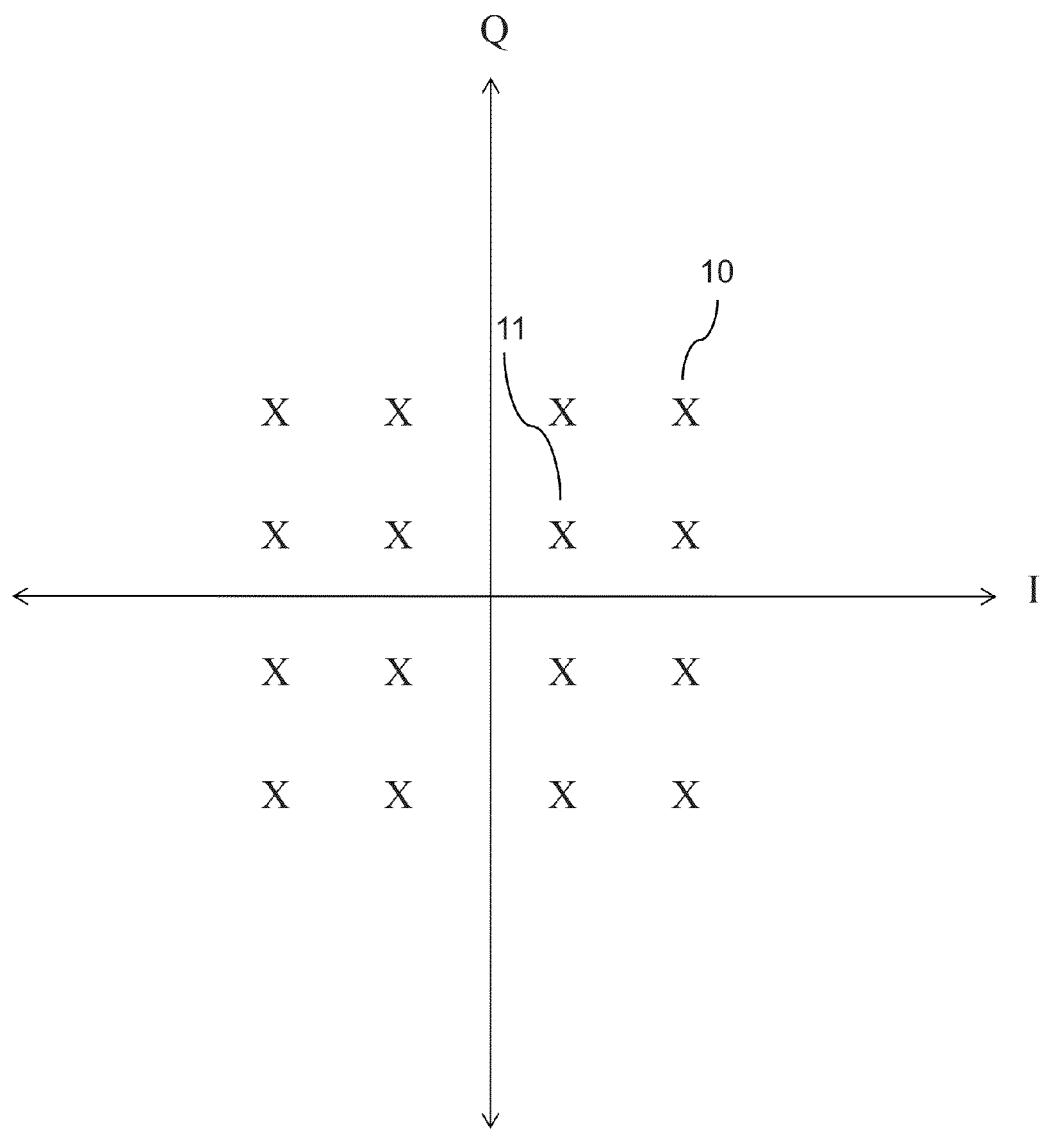
FIG. 1 shows a graph of an I-Q diagram.

Many radio frequency (RF) front ends that are currently present in cell phones and other wireless devices comprise discrete devices. However, a higher degree of integration in RF front ends may be desirable because market forces tend to push for greater data throughput, which can result in more complex waveforms being transmitted. For example, a constant envelope FM (frequency modulated) signal may be relatively simple compared to a waveform corresponding to 16 QAM (quadrature amplitude modulation). FIG. 1 shows an exemplary signal constellation corresponding to 16 QAM. Each 'X' represents one of 16 possible signals to be transmitted, where phase and amplitude of an RF waveform of a transmitted signal correspond to angle between a vector to an X representing the transmitted signal and a horizontal axis (I); and the length of such vector, respectively. Use of signal constellations to represent a modulation scheme used in producing an RF waveform is known by persons having ordinary skill in the art.

Transmission of more complex waveforms may, in turn, use amplifiers with more linearity, since distortion of amplitude or phase caused by nonlinearity may be less tolerated in terms of correct signal transmission. With reference to FIG. 1, a first signal 10 and a second signal 11 both have identical phase (e.g. direction of a vector from the origin to each of the two signals 10, 11) but different amplitudes (as expressed by magnitude of a vector from the origin to each of the two signals 10, 11). Nonlinearity of an amplifier can result in amplitude distortion, causing the first signal 10 to be erroneously transmitted when the second signal 11 was intended to be transmitted. As signal points in a signal constellation corresponding to a modulation scheme of an RF waveform become more densely packed, smaller amounts of amplitude distortion can result in erroneous signal transmission. In some cases, amplitude distortion can also result in phase distortion.

An amplifier can be more efficient in power use when operating nonlinearly as opposed to operating linearly (e.g., efficiency of class A amplifier being less efficient than a class B amplifier, the class B amplifier having lower linearity). Additionally, it may be desirable for an amplifier to be adapted/configured to operate in different modes (e.g., GSM vs. WCDMA) as well as on different frequency bands. The term "mode" is intended to refer to a given wireless standard and attendant modulation and coding scheme(s). Furthermore, there can be a consistent market push towards smaller sizes of cell phones and other wireless devices. Due to such demands for higher data throughput, better linearity, higher efficiency, multimode and/or multiband operation, there is a greater demand for a more integrated RF front end.

A more integrated RF front end where one or more components are adjustable can be reduced in size and complexity compared to a discrete RF front end with multiple elements that must be switched in order to accommodate different modes and different bands. One component that may enable such integration is an amplifier that can be dynamically adjusted during operation of a cell phone or wireless device with an adjustable amplifier. An RF front end comprising such an adjustable amplifier may not need to switch between multiple fixed amplifiers, but could rather use a smaller number (or just one) of the adjustable amplifiers to achieve desired performance characteristics (e.g., linearity, data throughput, multimode multiband operation, and so on).

Figure 2:
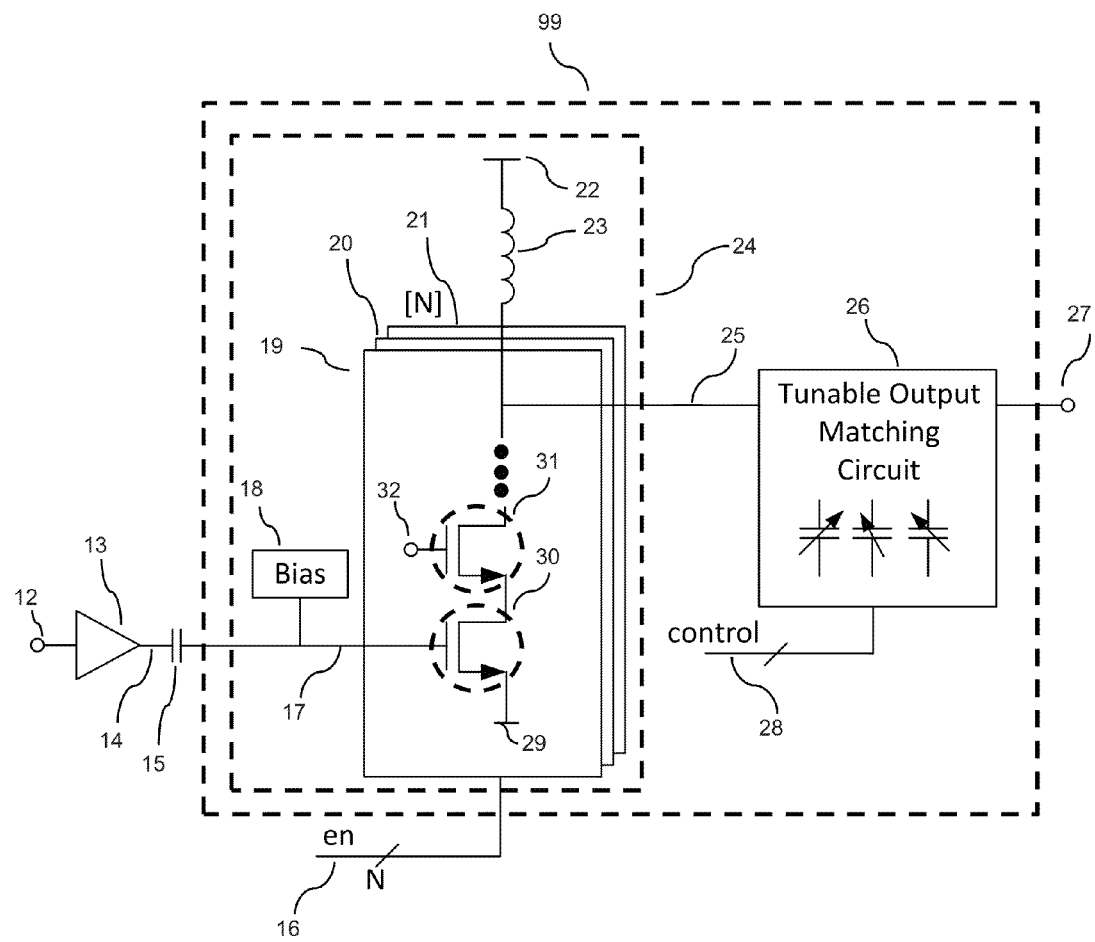
FIG. 2 shows an example scalable periphery power amplifier circuit coupled with a matching circuit and a driver stage amplifier.

An SPTM (scalable periphery tunable matching) amplifier can serve as an adjustable amplifier. FIG. 2 shows an example SPTM amplifier 99 with an input from a driver 13 and comprises an SP (scalable periphery) amplifier 24 with an SP output terminal 25 connected to a TM (tunable matching) circuit 26. An RF signal applied at an input terminal 12 can be amplified by the driver 13 to produce a driver amplified signal at a driver output terminal 14. The driver amplified signal at the driver output terminal 14 can be passed through a bypass capacitor 15 to produce a DC blocked driver amplified signal at an SPTM input terminal 17 corresponding to a gate of a first FET 30 (e.g., MOSFET). The source of the first FET 30 is connected to ground 29. A bias network 18 can also be connected to the SPTM input terminal 17 to set a DC bias point for the SPTM amplifier. A bias voltage can also be applied to a gate 32 of a second FET 31 or other FETs used in constructing the SP amplifier 24.

The SP amplifier 24 can amplify the DC blocked driver amplified signal at the SPTM input terminal 17 to produce an SP amplified signal at the SP output terminal 25. DC current can be supplied to the SP amplifier 24 from a voltage source 22 through an inductor 23 that acts as an RF choke, blocking flow of RF Power. In some embodiments, each amplifier segment 19, 20, 21 can be supplied by a separate voltage source connected via a separate inductor (RF choke). The SP amplified signal can be applied to the TM circuit 26 whereby the impedance can be adjusted by one or more control signals 28. The one or more control signals 28 can be provided by a control circuitry (not shown). The resulting SPTM amplified output signal can be sent out through an SPTM output terminal 27. The SPTM output terminal 27 can be connected to a load such as, but not limited to, an antenna of a cell phone; downstream splitters, duplex or other filters, cables, and/or feed networks used in delivering cable television service to a consumer; further amplifier stages; and/or a beam forming networking in a phased array radar system. These example loads as well as other loads may be known to a person skilled in the art.

The SP amplifier 24 can comprise one or more amplifier segment 19, 20, 21 connected in parallel. Each amplifier segment 19, 20, 21 can be selectively activated or deactivated by a corresponding enable signal 16 applied to the amplifier segments 19, 20, 21. Each enable signal 16 can be provided by control circuitry, not shown in FIG. 2. The enable signal 16 can be determined according to a desired bias current through the SPTM amplifier 99. Deactivating the amplifier segments can result in a decreased total bias current through the SP amplifier 24, while activating the amplifier segments can result in an increased total bias current through the SP amplifier 24. Selectively activating or deactivating the amplifier segments to adjust the bias current through the SP amplifier 24 will be referred to as adjusting a periphery of the SP amplifier 24.

Each amplifier segment 19, 20, 21 can comprise one or more transistors 30, 31 that are configured to operate as an amplifier. By way of example, and not of limitation, each amplifier segment can comprise a stack of two or more FETs 30, 31 (e.g., MOSFETs). The SPTM input terminal 17 corresponds to the gate of the first FET 30 in the stack of FETs, while an output signal is taken from a drain of a last (e.g., second, third, etc.) FET in the stack. This drain is connected to the SP output terminal 25.

The TM circuit 26 can comprise one or more variable reactances that can be adjusted such that the TM circuit 26 can yield variable impedances at the SP output terminal 25. A person skilled in the art would understand that instead of reactances, resistances can also be present in the TM circuit 26. Impedance of the TM circuit 26 can be adjusted by one or more control signals 28 applied to the variable reactances. Tunable matching circuits are also described, for example, in U.S. patent application Ser. No. 13/967,866, entitled "Tunable Impedance Matching Network", filed on Aug. 15, 2013, incorporated by reference herein in its entirety.

Figure 3:
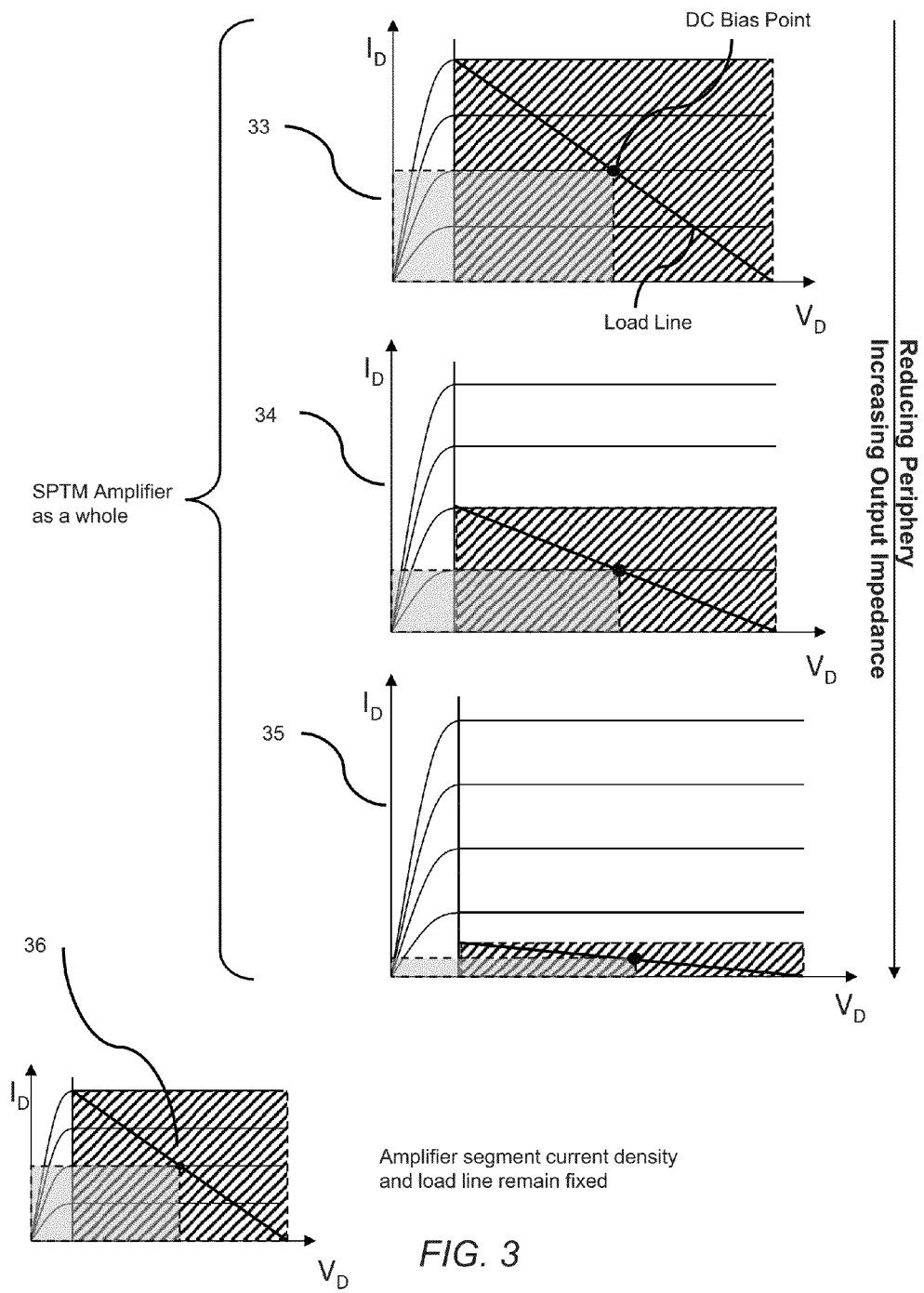
FIG. 3 shows various graphs of drain voltage vs. drain current in an amplifier circuits.

FIG. 3 shows graphs 33, 34, 35 with total current through the SP amplifier 24 represented on the vertical axis and voltage of the SPTM output terminal 27 represented on the horizontal axis. The diagonal load line has a slope that is equal to a negative reciprocal of resistance presented by the TM circuit 26 at the SP output terminal 25. The DC bias point indicates voltage across all amplifier segments 19, 20, 21 and total current through the SP amplifier 24 (sum of currents flowing through all active amplifier segments) when the RF signal is equal to zero. Although the graphs shown in FIG. 3 represent voltage and current characteristics for a class A amplifier, the amplifier segments 19, 20, 21 and the SPTM amplifier 99 can be configured as other amplifier classes such as, class B, class AB, and so on. The area of the shaded box can be proportional to RF power, while the area of the solid box can be proportional to DC power. Efficiency is generally a function of the ratio of RF power to DC power. As the RF signal oscillates, an operating point can move along the load line to indicate instantaneous voltage at the SP output terminal 25 and instantaneous total current through the SP amplifier 24.

Consider that graph 33 represents voltage and current characteristics of the SPTM amplifier 99 when all amplifier segments 19, 20, 21 are active, while the second graph 34 represents voltage and current characteristics of the SPTM amplifier 99 when half of all amplifier segments 19, 20, 21 have been turned OFF. In graph 34, the load line has been adjusted for a shallower slope, which corresponds to the increased load resistance. Because of the increased load resistance shown in graph 34 relative to that shown in graph 33, voltage swing (horizontal) at the SP output terminal 25 for a smaller current swing (vertical) can remain as large as the voltage swing shown in graph 33. The smaller current swing can be caused, for example, by a smaller voltage swing of the signal at the SPTM input terminal 17. Graph 35, can, for example, represent voltage and current characteristics of the SPTM amplifier when three fourths of all amplifiers segments 19, 20, 21 have been turned OFF. Because the load line has been adjusted for an even shallower slope (corresponding to increased load resistance) than in graph 34, for a smaller current swing (vertical), voltage swing (horizontal) at the SP output terminal 25 can remain as large as in graphs 33, 34.

The total bias current is adjusted by selectively activating or deactivating individual amplifier segments. Amplifier segments can be designed such that each amplifier segment that remains active exhibits a constant bias current. Graph 36 shows current and voltage characteristics for an individual amplifier segment that remains activated (e.g., ON). Both bias current and load resistance (negative reciprocal of slope of load line) can remain constant for the individual amplifier segment that remains ON. The load resistance seen by the individual amplifier segment that remains ON can be constant because, although the resistance presented by the TM circuit 26 increases, such resistance presented by the TM circuit 26 is distributed across a smaller number of amplifier segments operating in parallel.

With reference to graphs 33, 34, 35 shown in FIG. 3, the ratio of RF power to DC power can remain constant since the area of the shaded box decreases proportionally to the area of the solid box, as the periphery of the SPTM amplifier 99 is reduced in combination with the increase in resistance presented by the TM circuit 26 at the SP output terminal 25. Efficiency is a function of the ratio of RF power to DC power. Therefore, even at differing power levels, an efficiency of the SPTM amplifier 99 shown in FIG. 2 can remain constant. Another interpretation is that because voltage and current characteristics for each individual amplifier segment that remains ON can remain constant, as shown in graph 36 of FIG. 3, efficiency of each individual amplifier segment that remains ON can also remain constant. Therefore, efficiency of the overall SPTM amplifier shown in FIG. 2 can remain constant. More detailed information regarding SPTM amplifiers can be found, for example, in U.S. patent application Ser. No. 13/797,779, entitled "Scalable Periphery Tunable Matching Amplifier", filed on Mar. 12, 2013, incorporated by reference herein in its entirety.

According to some embodiments of the present disclosure and with continued reference to FIG. 2, the TM circuit 26 can comprise even and/or odd harmonic termination, such as to enhance certain harmonics (e.g. odd harmonics) and/or attenuate certain harmonics of a signal to be transmitted, for improved linearity and efficiency of the transmit circuitry. Such harmonic shorts and/or harmonic opens may be variable/configurable harmonic terminations, configured, for example, to adapt output/final stage of the amplifier to different modes and frequency bands via the variable components of the TM circuit 26. More information on variable harmonic terminations can be found in, for example, U.S. patent application Ser. No. 13/797,686, entitled "Variable Impedance Match and Variable Harmonic Terminations for Different Modes and Frequency Bands", filed on Mar. 12, 2013, which is incorporated herein by reference in its entirety.

Embodiments of the present disclosure describe electrical circuits in electronics devices (e.g., cell phones, transceivers) having a plurality of devices, such as for example, transistors (e.g., MOSFETS). Persons skilled in the art will appreciate that such electrical circuits comprising transistors can be arranged as amplifiers. Further, a plurality of such amplifiers can be arranged in the above described "scalable periphery" (SP) architecture of amplifiers where although a total number (e.g., 64) of amplifiers are provided, only a fraction of such amplifier segments (e.g., 32, 16, 8, or even 4, etc.) is used each time based on, for example, needs of the application being performed by the electronic device. For example, in some instances, the electronic device may desire to output a certain amount of power, which in turn, may require 32 of 64 SP amplifier segments to be used. In yet another application of the electronic device, a lower amount of output power may be desired, in which case, for example, only 16 of 64 SP amplifier segments are used. Additionally, the person skilled in the art would understand that the use of amplifiers in electronic devices can generate heat. Similarly to scaling the SP amplifier segments for output power requirements, the SP amplifier segments can be turned on and/or turned off to balance thermal distribution of the electronic circuit. In other words, in a given first time period, a first number of amplifier segments can be used, while in a subsequent time period, a different number of devices can be used based on desired power consumption/conservation or heat generation/distribution purposes.

The term "amplifier" as used in the present disclosure is intended to refer to amplifiers comprising single or stacked transistors configured as amplifiers, and can be used interchangeably with the term "power amplifier (PA)". Such amplifier and power amplifiers can be applicable to amplifiers and power amplifiers of any stages (e.g., pre-driver, driver, final), known to those skilled in the art. The scalable periphery amplifier segments can be connected to corresponding impedance matching circuits. The terms "turn on", "switch on" and "enable" can be used interchangeably and is intended to refer to allowing a device (e.g., amplifiers, amplifier segments, transistors) to operate. The terms "turn off", "switch off" and "disable" can be used interchangeably and is intended to refer to allowing a device (e.g., amplifiers, amplifier segments, transistors) to not operate.

Embodiments of the present disclosure also describe scalable periphery amplifier devices and their corresponding impedance matching circuits. Such scalable periphery amplifier devices have a particular impedance value according to the number of amplifier devices that are turned on or turned off at a given moment. The person skilled in the art would understand that other factors such as, for example, the configuration, arrangement, or material can also affect and vary the impedance of the amplifier device or the matching circuits.

As described above, an electronic circuit where all of the amplifiers of the scalable periphery architecture are turned on can be considered to be operating at full power, and such configuration can have a certain output impedance based on the number of amplifiers that are turned on. In some instances, it can be desirable to turn off some amplifiers to operate the electronic circuit at reduced power consumption or to reduce heat generation. Similar to measuring a total resistance of a plurality of resistors connected in parallel with each other, the total impedance of the plurality of amplifiers in an SP amplifier architecture can be calculated, simulated or measured in a similar manner. As known by those skilled in the art, the greater the number of amplifiers devices (in parallel), the lower the total impedance, and vice versa.

For determining the output impedance, an amplifier segment that is turned off can be considered an open circuit (e.g., power amplifier device removed). Thus, if a certain number of amplifiers segments are turned off, then the total impedance of the amplifier will be higher. On the other hand, if the amplifier segments are turned on, then the total impedance of the amplifier will be lower. As the amplifier segments are turned on or turned off, the number of amplifier segments contributing to the output impedance of the amplifier is increased or decreased.

Figure 4A:
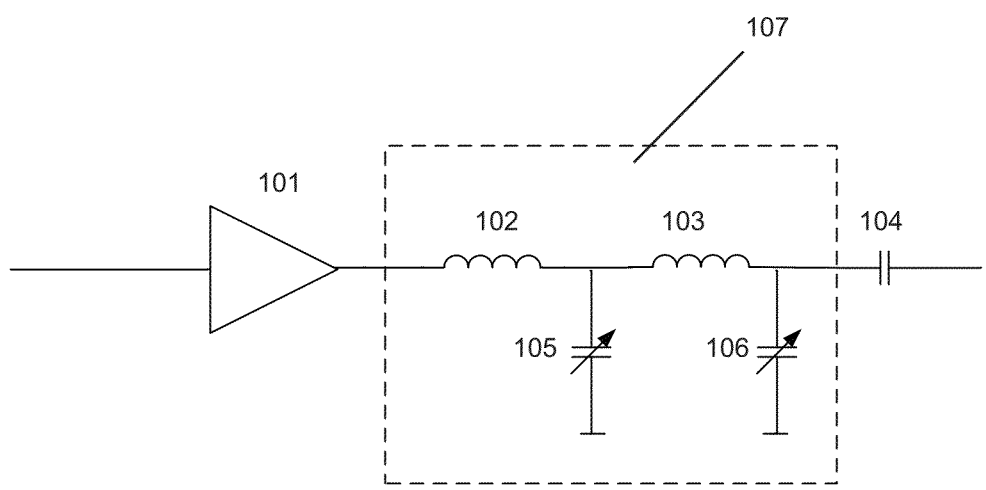
FIGS. 4A-4B show an exemplary scalable periphery power amplifier circuit coupled with a matching circuit.
Figure 4B:
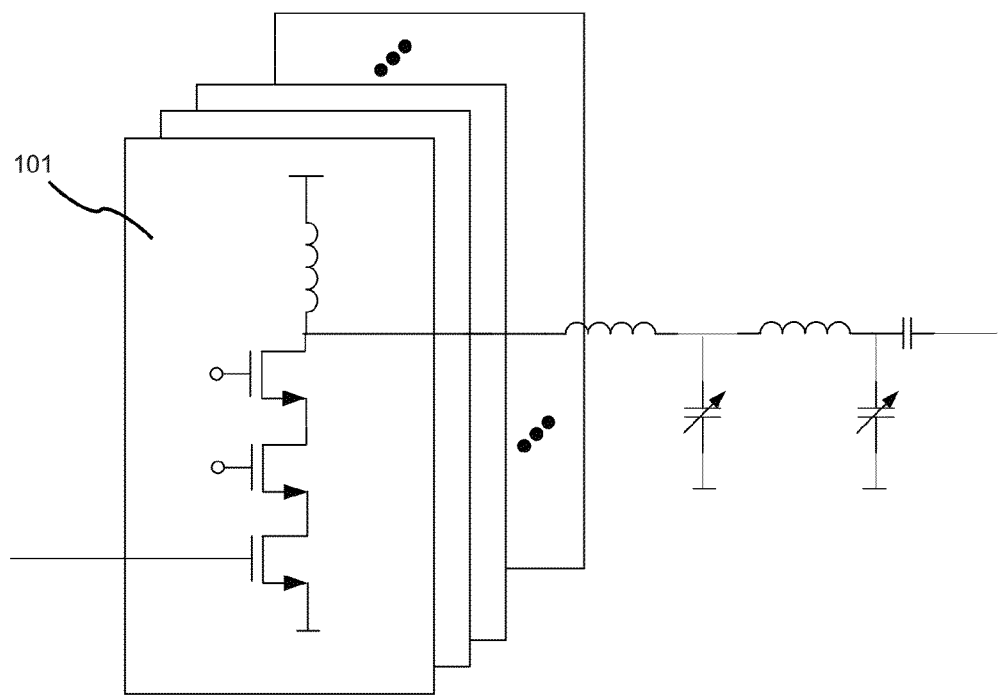

By way of example and not of limitation, FIGS. 4A-4B show an example SP amplifier circuit 101 electrically coupled with an impedance matching circuit 107, also referred to herein, and used interchangeably with the term "matching circuit". The exemplary matching circuits shown in FIGS. 4A-4B comprise a low pass filter, and will be used to describe various embodiments of the present disclosure. However, those skilled in the art will understand that the embodiments of the present disclosure can be applicable to a variety of other impedance matching circuits.

The amplifier circuit 101 shown in FIG. 4B represents a plurality of amplifiers, for example, 64 amplifier segments. Inductors 102, 103 and digital tunable capacitors (DTCs) 105, 106 make up the exemplary matching circuit (e.g., low pass filter), and capacitor 104 is a coupling capacitor. The exemplary matching circuit 107 can have impedance that can be changed by adjusting, or tuning the DTCs 105, 106. DTCs are described in detail, for example, in U.S. patent application Ser. No. 12/735,954, which is incorporated herein by reference in its entirety.

Although not shown in FIGS. 4A-4B, according to some embodiments of the present disclosure, inductors 102 and/or 103 can also be variable inductors, such as for example, digital tunable inductors (DTLs), such as to provide further flexibility in adjustment of a response of the TM circuit 107 of FIG. 4A. More information regarding tunable reactive elements, including digitally tunable inductors (DTLs), may be found, for example, in U.S. patent application Ser. No. 13/595,893 entitled "Method and Apparatus for Use in Tuning Reactance in an Integrated Circuit Device", filed on Aug. 27, 2012, which is incorporated herein by reference in its entirety.

In an exemplary electronic circuit, such as the one shown in FIGS. 4A-4B, the output impedance of the SP amplifier circuit 101 and the impedance of the matching circuit 107 are matched, such that the impedances are substantially equal to one another. As the amplifier segments of the SP amplifier circuit 101 are turned on or turned off (e.g., according to power requirements), the output impedance of the SP amplifier will change, thus no longer matching the impedance of the matching circuit 107.

Those skilled in the art will understand that coupling an amplifier circuit 101 with a circuit whose output impedance does not match with the output impedance of the SP amplifier 101 can generate splatter in an adjacent channel, thus failing to meet adjacent channel coupled power or adjacent channel leakage ratio (ACLR) specifications (e.g., wideband CDMA specification). In order to compensate for the mismatch of the output impedance, the impedance of the matching circuit 107 can be adjusted to match the impedances as close to each other as possible. Thus, when turning on or turning off a certain number of amplifier segments, the impedance of the matching circuit 107 can be first adjusted or the amplifier segments can be first turned on and/or turned off. Applicants have found that the sequence of matching impedances (e.g., adjust the matching circuit first or last) can ensure that output power is kept within specification and does not leak to adjacent channels.

According to an embodiment of the present disclosure, in order to maintain linearity and avoid spectral splatter, when it is desired to turn off one or more of the SP amplifier segments, the impedance of the matching circuit 107 is first changed to the expected new impedance of the amplifier circuit. Then, the amplifier segments can be turned off once the impedance of the matching circuit is first adjusted. By adjusting the impedance of the matching circuit 107 before turning off the amplifier segments, linearity of the amplifier circuit can be maintained, which can be shown using a Smith Chart, explained later.

By way of example and not of limitation, when all 64 amplifier segments of the amplifier circuit 101 are turned on, the amplifier circuit 101 can have an impedance of 2 ohms. DTC 105 can have a reactance of 3 ohms and DTC 106 can have a reactance of 5 ohms, thus the matching circuit 107 realizes an impedance of approximately 2 ohms. Therefore, the impedance of the amplifier circuit 101 and the matching circuit 107 are approximately equal, thus matching.

When a certain number of amplifier segments of the amplifier circuit 101 are turned off, for example, 32 of the 64 amplifier segments, the output impedance of amplifier circuit 101 increases, for example, to 4 ohms. However, the impedance of the matching circuit 107 is still approximately 2 ohms, and therefore does not match with the output impedance of the amplifier circuit 101. Although the impedance of the matching circuit 107 can be changed to match the new output impedance of the amplifier circuit 101, matching of the impedances in this order can result in spectral splatter.

Figure 5:
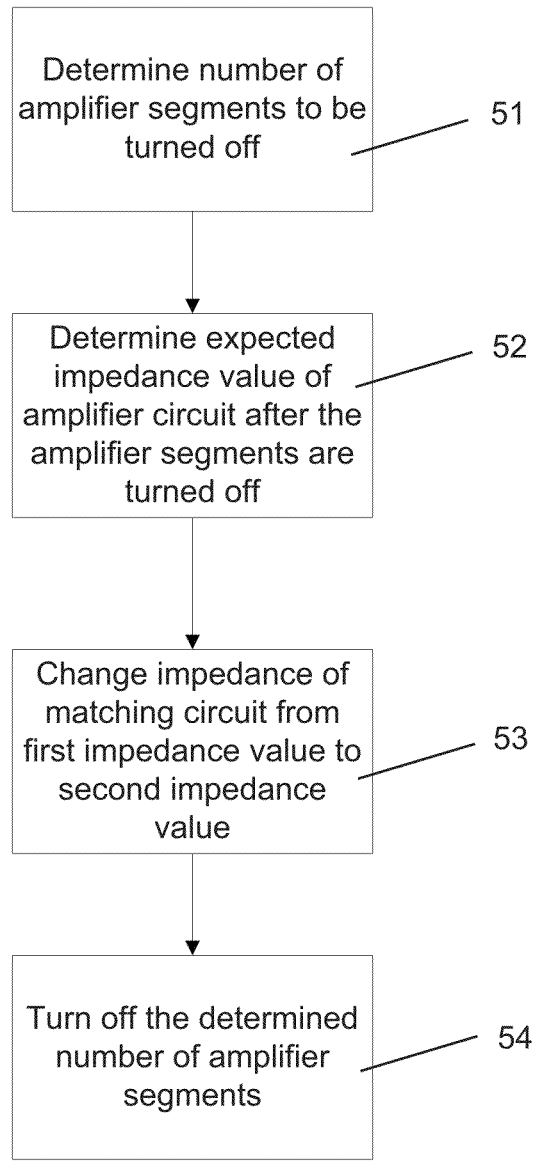
FIG. 5 shows a flow chart of an exemplary sequence of turning off a number of amplifier segments.

According to an embodiment of the present disclosure, in order to facilitate impedance matching, the impedance of the matching circuit 107 is changed first, prior to turning off the amplifier segments of the amplifier circuit 101 when the 32 amplifier segments are expected to be turned off. By way of example and not of limitation, adjustable components of the matching circuit 107 can be adjusted first, such as for example DTCs 105, 106, until the impedance of the matching circuit 107 is substantially equal to the output impedance expected of the amplifier circuit 101 when the amplifier segments are disabled (see steps 51-52 in FIG. 5). Once such desired impedance is established by the matching circuit 107, the amplifier segments of amplifier circuit 101 can be turned off (see steps 53-54 in FIG. 5). In the case where inductors 102 and 103 of the matching circuit 107 are adjustable (e.g. DTLs), these inductors can also be adjusted prior to turning off the amplifier segments of the amplifier circuit 101.

Figure 6:
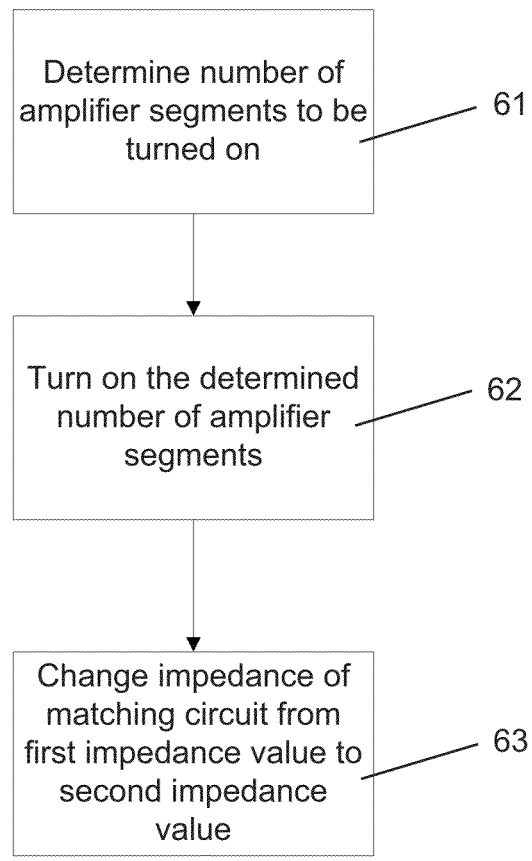
FIG. 6 shows a flow chart of an exemplary sequence of turning on a number of amplifier segments.

According to another embodiment, similar to turning off the amplifier segments, when it is desired to turn on the amplifier segments, an impedance mismatch between the amplifier and the matching circuit is also created. Differently from when turning off the amplifier segments, when it is desired to turn on amplifier segments, the amplifier segments can be turned on first, before changing the impedance of the matching circuit 107. In other words, the impedance of the amplifier is first lowered (by turning on one or more amplifier segments), then the impedance of the matching circuit is lowered next (see steps 61-63 in FIG. 6). By performing the impedance matching in this order, the impedance of the matching circuit 107 is always substantially equal or higher than the impedance of the amplifier, thus maintaining linearity and avoiding spectral splatter in the adjacent channels.

In some embodiments, the electronic circuit can comprise a controller that can be programmed to turn on and/or turn off the amplifier segments and change the impedance of the matching circuit by adjusting, for example, the DTCs. Such controller can be programmed with the expected impedance values of the amplifier circuit when portions of amplifier segments are turned on and/or turned off. Therefore, according to the embodiments described above, the impedance of the matching circuit can be changed either before or after turning off or turning on, respectively, the amplifier segments to match the expected new impedance of the amplifier circuit. By way of example and not of limitation, the controller can be programmed such that when 64 amplifier segments are turned on, the impedance is 2 ohms, while when 32 amplifier segments are turned on, the impedance is 4 ohms, etc. Therefore, when it is desired to turn off 32 amplifier segments of the 64 amplifier segments, the controller knows that turning off 32 amplifier segments would result in an impedance of 4 ohms, and therefore should change the impedance of the matching circuit to 4 ohms before turning off the 32 amplifier segments. A person skilled in the art would understand that such impedance values are just example values and can differ depending on the various configurations, arrangements, and material used.

Figure 7:
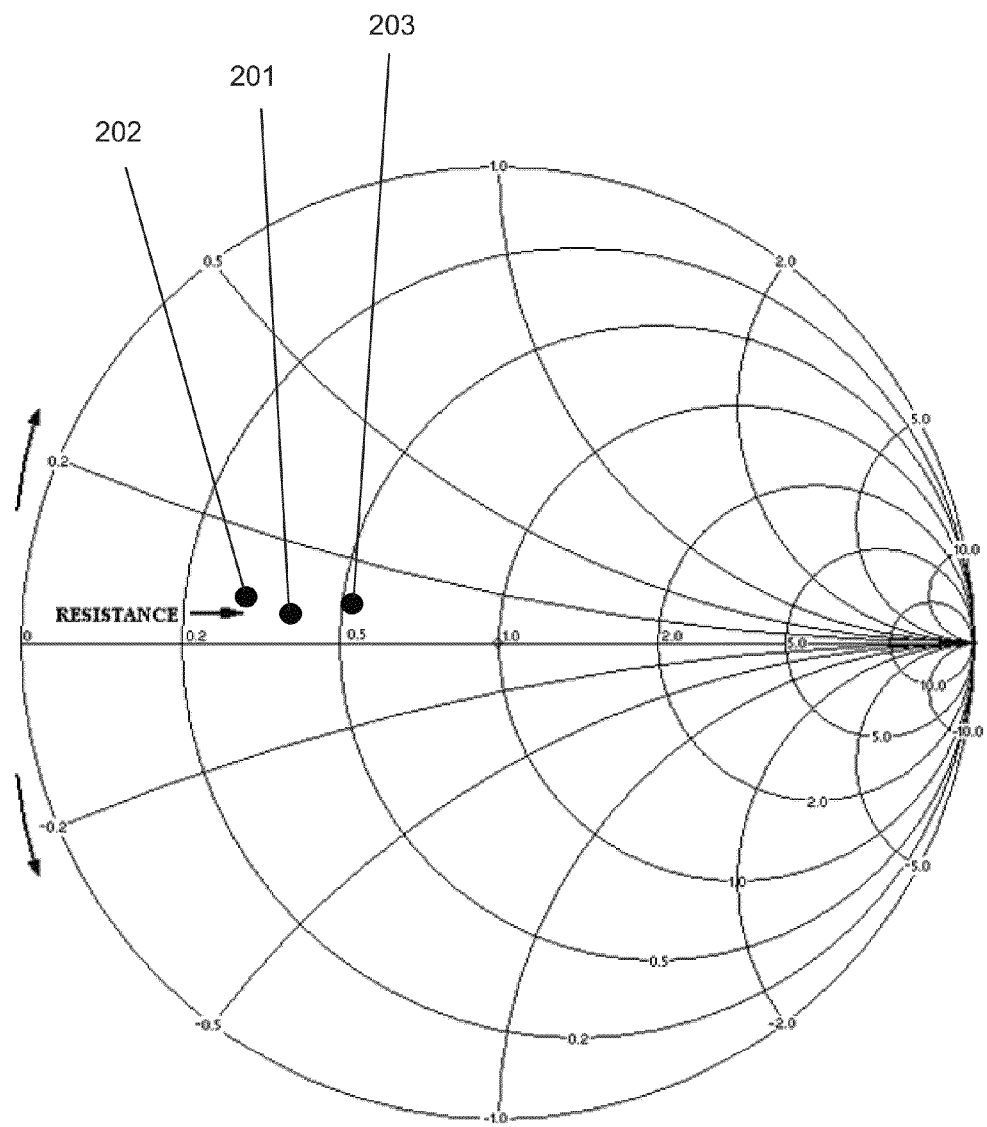
FIG. 7 shows an exemplary Smith chart showing a shift in impedance as a consequence of turning on or turning off the scalable periphery amplifiers.

FIG. 7 shows a Smith chart showing the location of approximate impedance value with a dot 201 when all 64 amplifier devices of the amplifier circuit 101 are turned on. In the case where 32 amplifier devices are first turned off (thereby changing the impedance of the amplifier circuit 101) before changing the impedance of the matching circuit 107, the impedance value of the amplifier on the Smith chart moves toward the right while the impedance value of the matching circuitry stays at point 201 (thus away from linearity) as shown with dot 203. Consequently, spectral splatter increases. In other words, the impedance of the amplifier moves toward the right (e.g., point 203), while the impedance value of the matching circuitry is still ideally at point 201, which is away from linearity and higher spectral splatter.

In the case where the impedance of the matching circuit 107 is first adjusted to the expected output impedance of the amplifier circuit 101, and then the 32 amplifier segments are turned off, the impedance value of the matching circuitry on the Smith chart moves toward the right (thus towards linearity) as shown with dot 203. The amplifier circuit 101 operates more linearly in this higher impedance value (while the impedance of the amplifier is still at point 201 before it is switched off), and spectral splatter is also reduced.

Although an impedance mismatch is created by changing the number of turned on amplifier segments, by first adjusting the impedance of the matching circuit before turning off the amplifier segments when reducing the number of turned on amplifier segments, or turning on the amplifier segments before adjusting the impedance of the matching circuit, the impedance of the matching circuit can be maintained at a higher impedance relative to the amplifier impedance, thus maintaining linearity and avoiding spectral splatter.

Figure 8A:
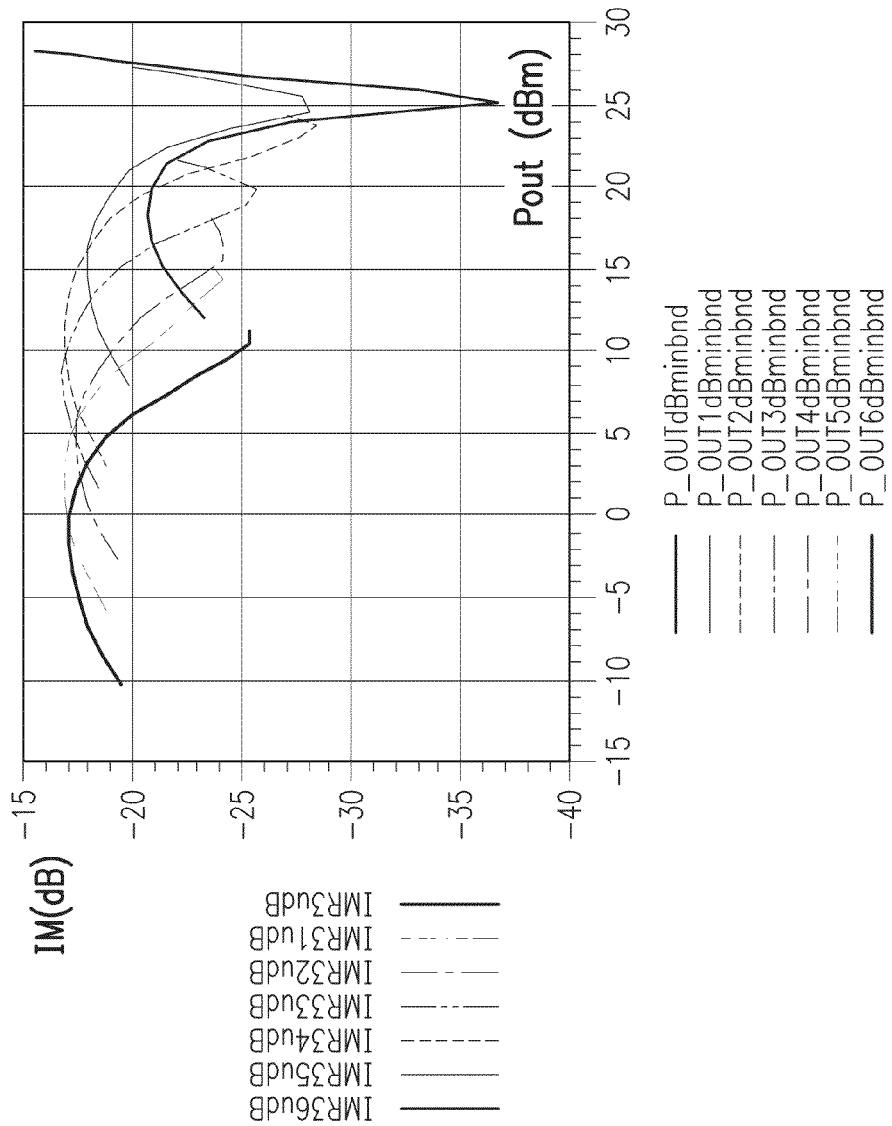
FIGS. 8A-8D show graphical responses for two different methods of matching impedance in an exemplary circuital arrangement.
Figure 8B:
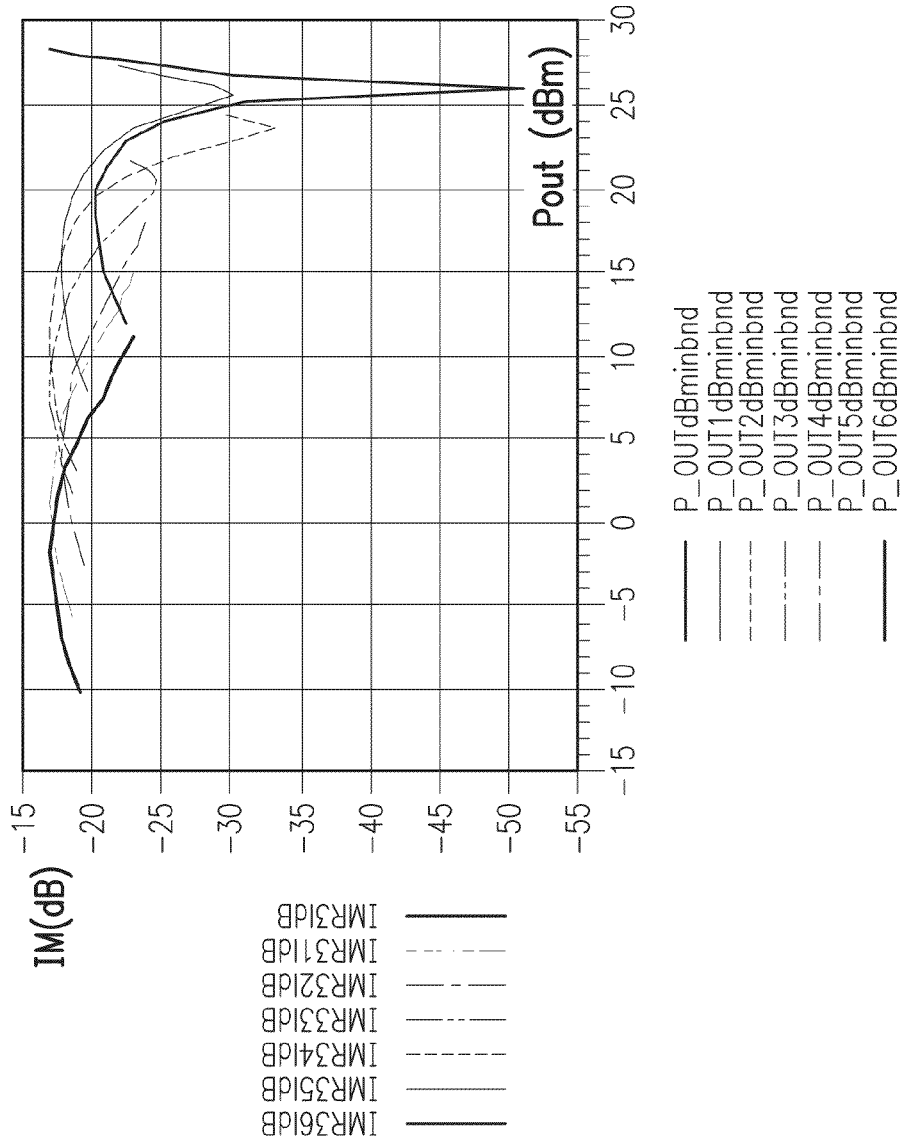

FIGS. 8A-8B show example responses of third order intermodulation (IM3) when the impedance of the matching circuit is lower than the impedance of the amplifier circuit, for example, when the amplifier devices are first switched off before the impedance of the matching circuit is 107 is first increased. FIG. 8A shows the IM3 products above the main carrier and FIG. 8B shows the IM3 products below the carrier. By way of example and not of limitation, a figure of merit can be −25 dBc. Persons skilled in the art would recognize that linearity and spectral splatter will be maintained if the IM3 products are more negative than −25 dBc. The IM3 responses in FIGS. 8A-8B stay above −25 dBc for low power conditions and only for narrow ranges of output power for the three highest output power settings. This leads to spectral splatter during switching to the lower power states.

Figure 8C:
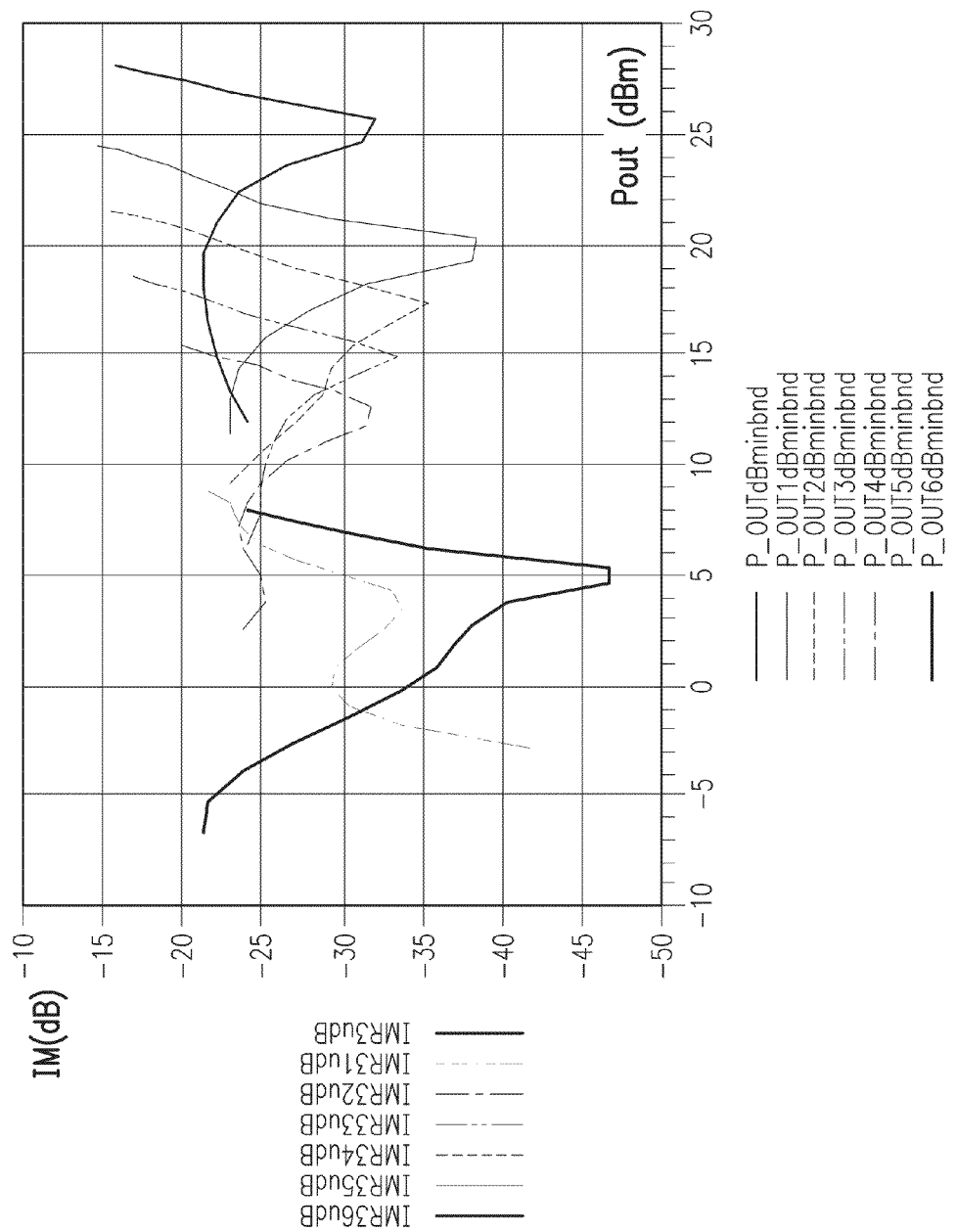
Figure 8D:
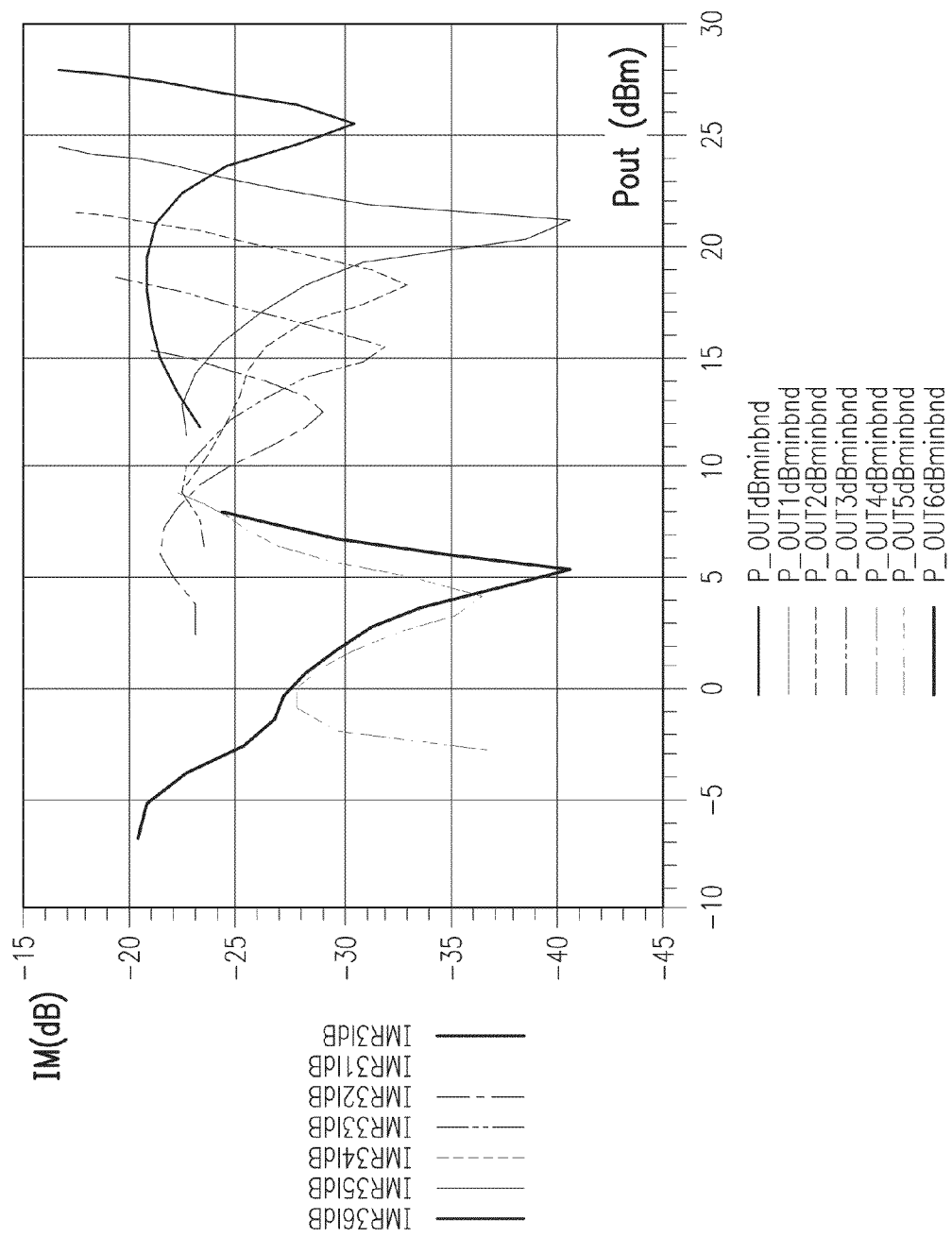

FIGS. 8C-8D show example IM3 responses when the matching circuit 107 is first adjusted before the amplifier segments are turned off. Larger ranges of output power is apparent for all cases of reduced periphery that the IM3 is maintained below −25 dBc. This shows that linearity is maintained and spectral splatter is avoided.

Although the process of turning on and/or off the amplifier segments and the changing the impedance of the matching circuit occurs sequentially, such sequence occurs almost simultaneously. The delay can be in the range of approximately 50 microseconds.

In some embodiments, switching from a first kind of periphery (e.g., 64 amplifier segments) to a second kind of periphery (e.g., 32 amplifier segments) may entail relevant thermal considerations. In other words, if the entire periphery contains 64 amplifier segments and the top 32 amplifier segments (assuming the devices are arranged in a straight line from top to bottom) are turned off, the electrical circuit in which the devices are located may be unbalanced in terms of heat consumption, with possible undesired effects on the functions of the circuit. For example, the upper section may cool down while the lower section may continue to generate concentrated heat.

A turning off (and/or corresponding turning on) method can be desired that minimizes, or at least reduces such imbalance of heat consumption, thereby reducing the possibility of the undesired effects on the functions of the circuit. By way of example and not of limitation, FIG. 9A shows an example schematic arrangement of a plurality of amplifier segments in the scalable periphery 401 architecture having a total of 16 amplifier segments 400A-400P. Although the scalable periphery amplifier architecture can comprise any number of amplifier devices, for purposes of providing examples in the present disclosure, an exemplary system comprising 16 amplifier devices is described, as shown in FIGS. 9A-9C.

According to some embodiments, it may be desirable to turn off one or more of the amplifier segments 400A-400P, for example, to reduce power consumption or to minimize heat generation. One possible method is to turn off half (8 of 16) of the amplifier segments, while leaving on the other half of the amplifier segments, thereby reducing the amount of power consumed by the amplifier circuit. The amplifier circuit, in addition to consuming power, can generate and thus dissipate heat when in operation. In addition to just turning off a number of amplifier segments, it can be desirable to turn off those amplifier segments in a configuration that can facilitate uniform distribution of the dissipating heat.

In some embodiments, assuming that switching from a configuration where all of the segments are used, to a configuration where only half of such segments are used is desired, half of the amplifier segments can be turned off in a specific configuration so as to distribute dissipating heat more uniformly among the amplifier devices. By way of example and not of limitation, one possible configuration as shown in FIG. 9B is to turn off every odd amplifier devices 400A, 400C, 400E, 400G, 400I, 400K, 400M, 400O, or every even amplifier devices 400B, 400D, 400F, 400H, 400J, 400L, 400N, 400P, thereby more evenly spreading out the heat generated from each of the amplifier segments.

In such configuration where every other amplifier device is switched off, the generated heat is distributed more uniformly across the entire amplifier circuit because the distance between adjacent amplifier segments that are on are greater than the distance between adjacent amplifier segments that are on before turning off every other amplifier segments. Consequently, heat concentration in a given area as a result of heat dissipation from one amplifier segment that is on and one amplifier segment that is off (e.g., after turning off), is less than the heat concentration in the same sizable area as a result of heat dissipation from two amplifier segments that are on (e.g., before turning off). As a result, the overall circuit can allow for uniform heat distribution, improved heat dissipation, thus a cooler device, which in turn, can improve electrical performance.

In some cases, as shown in FIG. 9C, the temperature of the amplifier segments located toward the center region of the scalable periphery amplifier circuit shown with box 401 can be higher than the temperature of the amplifier segments located toward the outer region of the scalable periphery amplifier segments since the amplifier segments in the center region 401 are surrounded by other amplifier segments, which are also generating heat. On the other hand, the amplifier segments toward the outer region of the scalable periphery amplifier segments (e.g., 400A, 400B, 400O, 400P) can dissipate their heat in an outward direction toward the edges where there are no other amplifier segments.

In some cases, other heat dissipation factors can also be considered for further uniform heat distribution. For example, the amplifier segments located toward the center region 400G, 400H, 400I, 400J of the scalable periphery amplifier segments can be more difficult to dissipate heat since those amplifier segments are surrounded by more adjacent amplifier segments which are also generating heat, compared to the amplifier segments located toward the outer regions (e.g., 400A-400F, 400K-400P) of the scalable periphery amplifier segments where there are less, or no adjacent amplifier segments.

By way of example and not of limitation, a subset of amplifier segments in the center region 400G, 400H, 400I, 400J can be turned off to reduce the heat load of the highest concentrated region. Assuming it is still desired to turn off exactly half of the total number of amplifier segments, in addition to turning off the subset of amplifier segments in the center region, four additional amplifier segments can also be turned off. FIG. 9C shows one such example configuration where amplifier segments 400C, 400E, 400L, 400N are turned off, such that a total of 8 out of 16 amplifier segments are turned off. The person skilled in the art will understand that other configurations are also possible to obtain substantially similar distribution of heat, thus avoiding hotspots.

In some embodiments, similarly to turning off the amplifier segments as described herein, a corresponding turning on method can be used to turn on the amplifier segments, for example, to full power where all of the amplifier segments of the scalable periphery amplifier segments are on. Such turning on procedure can be performed in a reverse order from which the amplifier devices were turned off.

The examples set forth above are provided to give those of ordinary skill in the art a complete disclosure and description of how to make and use the embodiments of the present disclosure, and are not intended to limit the scope of what the inventors regard as their disclosure. Modifications of the above described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.)

The invention claimed is:

1. A method of turning off a subset of amplifier segments in an amplifier circuit comprising a plurality of amplifier segments, the method comprising:
   providing a matching circuit coupled with the amplifier circuit, the matching circuit having a first impedance value substantially matching a first output impedance value of the amplifier circuit;
   determining a number of amplifier segments of the plurality of amplifier segments to be turned off;
   determining a second output impedance value of the amplifier circuit expected upon turning off the determined number of amplifier segments;
   changing the first impedance value of the matching circuit to a second impedance value of the matching circuit, the second impedance value of the matching circuit being substantially equal to the determined second output impedance value of the amplifier circuit; and
   turning off, upon the changing, the number of amplifier segments determined to be turned off, thus changing the first output impedance value of the amplifier circuit to an actual second output impedance value of the amplifier circuit, wherein the actual second output impedance value of the amplifier circuit substantially matches the second impedance value of the matching circuit.

2. The method according to claim 1, wherein the first impedance value and the second impedance value of the matching circuit are substantially equal to or greater than the corresponding first output impedance value and second output impedance value of the amplifier circuit at all times.

3. The method according to claim 1, wherein the matching circuit is a low pass filter.

4. The method according to claim 1, wherein the matching circuit comprises one or more digital tunable capacitors (DTC) and/or one or more digital tunable inductors (DTLs).

5. The method according to claim 4, wherein the first impedance value of the matching circuit is changed to the second impedance value of the matching circuit by adjusting the one or more digital tunable capacitors.

6. The method according to claim 1, wherein the first impedance value of the matching circuit is different from the second impedance value of the matching circuit.

7. The method according to claim 1, wherein the first impedance value of the amplifier circuit is different from the second output impedance value of the amplifier circuit.

8. The method according to claim 1, wherein the turning off lowers an output power of the amplifier circuit.

9. A method for turning on a subset of amplifier segments in an amplifier circuit, the method comprising:
   providing a matching circuit coupled with the amplifier circuit, the matching circuit having a first impedance value substantially matching a first output impedance value of the amplifier circuit;
   determining a number of amplifier segments of a plurality of amplifier segments to be turned on;
   determining a second output impedance value of the amplifier circuit expected upon turning on the determined number of amplifier segments;
   turning on the number of amplifier segments determined to be turned on, wherein the turning on the number of amplifier segments establishes a second output impedance value of the amplifier circuit; and
   changing the first impedance value of the matching circuit to a second impedance value of the matching circuit, the second output impedance value of the matching circuit being substantially equal to the second output impedance value of the amplifier circuit.

10. The method according to claim 9, wherein the first impedance value and the second impedance value of the matching circuit are substantially equal to or greater than the corresponding first output impedance value and second the output impedance value of the amplifier circuit at all times.

11. The method according to claim 9, wherein the turning on increases an output power of the amplifier circuit.

12. The method according to claim 9, wherein the matching circuit comprises one or more digital tunable capacitors and one or more inductors.

13. The method according to claim 12, wherein the first impedance value of the matching circuit is changed to the second impedance value of the matching circuit by adjusting the one or more digital tunable capacitors.

14. The method according to claim 9, wherein the first impedance value of the matching circuit is different from the second impedance value of the matching circuit.

15. The method according to claim 9, wherein the first impedance value of the amplifier circuit is different from the second output impedance value of the amplifier circuit.

16. A circuit arrangement comprising:
   an amplifier circuit comprising a plurality of amplifier segments and having an output impedance; and
   a matching circuit coupled with the amplifier circuit, the matching circuit comprising one or more inductors and one or more digital tunable capacitors,
   wherein the amplifier circuit output impedance has a first value in a first configuration of the amplifier segments, the first value adapted to change to a second value in a second configuration of the amplifier segments, and
   wherein an impedance value of the matching circuit is configured to be adjustable to substantially equal or exceed the output impedance of the amplifier circuit before the output impedance of the amplifier circuit is changed from the first value to the second value.

17. The circuit arrangement according to claim 16, wherein the impedance value of the matching circuit is adjusted before changing the output impedance of the amplifier circuit.

18. The circuit arrangement according to claim 16, wherein the impedance value of the matching circuit is adjusted after changing the output impedance of the amplifier circuit.

* * * * *